US009553279B2

United States Patent
Toyoda et al.

(10) Patent No.: US 9,553,279 B2
(45) Date of Patent: Jan. 24, 2017

(54) ORGANIC EL DISPLAY DEVICE COMPRISING DIFFERENT PATTERNS IN EDGE AND INNER REGIONS

(71) Applicant: Japan Display Inc., Tokyo (JP)

(72) Inventors: Hironori Toyoda, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/791,838

(22) Filed: Jul. 6, 2015

(65) Prior Publication Data

US 2016/0006000 A1    Jan. 7, 2016

(30) Foreign Application Priority Data

Jul. 7, 2014    (JP) .................................. 2014-139717

(51) Int. Cl.
   *H01L 51/52*    (2006.01)
   *H01L 27/32*    (2006.01)

(52) U.S. Cl.
   CPC ....... *H01L 51/5218* (2013.01); *H01L 51/5209* (2013.01); *H01L 51/5237* (2013.01); *H01L 51/5246* (2013.01); *H01L 27/3246* (2013.01); *H01L 51/5253* (2013.01); *H01L 51/5265* (2013.01); *H01L 51/5271* (2013.01)

(58) Field of Classification Search
   CPC ............. H01L 27/3246; H01L 51/5218; H01L 51/5237; H01L 51/5246; H01L 51/5271
   See application file for complete search history.

(56) References Cited

U.S. PATENT DOCUMENTS

| 2003/0064171 | A1  | 4/2003  | Burrows et al. |
| 2005/0242720 | A1* | 11/2005 | Sano ................... H01L 51/5259 313/506 |
| 2007/0114521 | A1* | 5/2007  | Hayashi ............. H01L 51/5253 257/40 |
| 2008/0036366 | A1* | 2/2008  | Yaegashi ............. H01L 51/5218 313/504 |
| 2009/0309486 | A1  | 12/2009 | Imai et al. |
| 2010/0295759 | A1  | 11/2010 | Tanaka |

FOREIGN PATENT DOCUMENTS

| JP | 2007-184251 A | 7/2007 |
| JP | 4303591 B2    | 7/2009 |
| JP | 2010-272270 A | 12/2010 |

* cited by examiner

*Primary Examiner* — Eduardo A Rodela
*Assistant Examiner* — Christopher M Roland
(74) *Attorney, Agent, or Firm* — Typha IP LLC

(57) ABSTRACT

An organic EL display device includes lower electrodes each provided for each of pixels, a bank layer formed so as to cover the peripheries of the lower electrodes and including bank openings through each of which a portion of the lower electrode is exposed, a light-emitting layer, an organic layer including portions each formed in the bank opening, a first barrier layer covering the organic layer, a second barrier layer covering the first barrier layer, an intermediate layer located at the edges of the bank openings, and light reflection films each provided under the lower electrode for each of the pixels. A first region where the intermediate layer is present when the pixel is viewed in a plan view includes, above or under the intermediate layer, a different layer structure from that of a second region inside the first region.

2 Claims, 6 Drawing Sheets

L1=A
L2=B

ORGANIC EL DISPLAY DEVICE COMPRISING DIFFERENT PATTERNS IN EDGE AND INNER REGIONS

CROSS-REFERENCE TO RELATED APPLICATION

The present application claims priority from Japanese application JP2014-139717 filed on Jul. 7, 2014, the content of which is hereby incorporated by reference into this application.

BACKGROUND OF THE INVENTION

1. Field of the Invention

The present invention relates to an organic EL display device.

2. Description of the Related Art

An organic electroluminescent (EL) display device includes lower electrodes each disposed for each of pixels, and banks that define the pixels. An opening is formed in the bank, and the lower electrode is exposed inside the opening. An organic layer including a light-emitting layer covers the banks and the lower electrodes, and is in contact with the lower electrodes inside the bank openings. Hence, light is emitted through the bank opening. The organic layer is susceptible to degradation from moisture, and therefore, the organic EL display device is provided with a barrier structure that covers the organic layer and prevents the permeation of moisture therethrough.

Moreover, in some organic EL display devices, a microcavity effect of light emitted from the light-emitting layer is used to improve light extraction efficiency. That is, in the organic EL display devices, the light emitted from the light-emitting layer is reflected and resonated between a plurality of layers formed in the display device.

SUMMARY OF THE INVENTION

In the barrier structure for protecting the organic layer, a pinhole is formed in some cases due to a foreign substance. When the pinhole is formed, moisture enters through the pinhole and degrades the organic layer. The present inventor has studied a barrier structure that is formed of an organic material and a plurality of barrier layers formed of an inorganic material. A first barrier layer covers the organic layer including the light-emitting layer. The organic material is present in a dispersed manner on the first barrier layer. Hereinafter, the portion where the organic material is formed is referred to as "intermediate layer". When a foreign substance is present on the first barrier layer, the intermediate layer is formed so as to surround the foreign substance. A second barrier layer covers the first barrier layer and the intermediate layer. According to this structure, a difference in level around the foreign substance is reduced by the intermediate layer. Therefore, even when the second barrier layer is reduced in thickness, the second barrier layer can completely cover the foreign substance. As a result, it is possible to effectively suppress the permeation of moisture through the organic layer. The intermediate layer is formed as follows, for example: A solvent including the organic material is sprayed on the first barrier layer. The sprayed solvent gathers around the foreign substance due to surface tension. When the solvent gathering around the foreign substance is solidified, it serves as the intermediate layer.

In the forming process of the intermediate layer, however, the intermediate layer is formed not only around the foreign substance but also at the peripheral portion of the bank opening. Specifically, the intermediate layer is formed at a corner between the side surface of the bank and the surface of the lower electrode. For this reason, an optical distance in the peripheral portion of the bank opening varies from that in the central portion thereof, which affects the microcavity effect. Therefore, there is a problem of difference in emission color between the peripheral portion and central portion of the bank opening. When a black matrix is formed so as to cover the peripheral portion of the bank opening, the difference in emission color is not visible but there arises a problem of reduction in the aperture ratio of the pixel.

It is an object of the invention to provide an organic EL display device capable of reducing a difference in emission color between the peripheral portion and central portion of a bank opening.

(1) An organic EL display device according to an aspect of the invention includes: lower electrodes each provided for each of pixels; a bank layer formed so as to cover the peripheries of the lower electrodes and including bank openings through each of which a portion of the lower electrode is exposed; an organic layer including a light-emitting layer and portions each formed in the bank opening; a first barrier layer covering the organic layer; a second barrier layer covering the first barrier layer; an intermediate layer formed between the first barrier layer and the second barrier layer, formed of a different material from those of the first barrier layer and the second barrier layer, and located at the edges of the bank openings; light reflection films each provided under the lower electrode for each of the pixels; a first region where the intermediate layer is located when the pixel is viewed in a plan view; a second region located inside the first region, wherein the first region includes, above or under the intermediate layer, a different layer structure from that of the second region.

(2) In the organic EL display device according to (1), one of the first region and the second region includes, above or under the intermediate layer, a layer that is not present in the other.

(3) In the organic EL display device according to (1), a distance from the organic layer to the light reflection film in the first region is different from a distance from the organic layer to the light reflection film in the second region.

(4) In the organic EL display device according to (3), the number of layers present between the organic layer and the light reflection film in the first region is different from that of in the second region.

(5) In the organic EL display device according to (3), a first light reflection film and a second light reflection film are provided as the light reflection film for each of the pixels, the organic EL display device further includes a conductive film under the lower electrode, the first light reflection film, the conductive film, the second light reflection film, the lower electrode, and the organic layer are formed in this order, and one of the first region and the second region includes the second light reflection film, while the other includes the first light reflection film and does not include the second light reflection film.

(6) In the organic EL display device according to (3), the organic EL display device further includes a conductive film above the lower electrode, the light reflection film, the lower electrode, the conductive film, and the organic layer are formed in this order, and one of the first region and the second region includes both the lower electrode and the conductive film, while the other includes the lower electrode and does not include the conductive film.

DETAILED DESCRIPTION OF THE INVENTION

Figure 1:
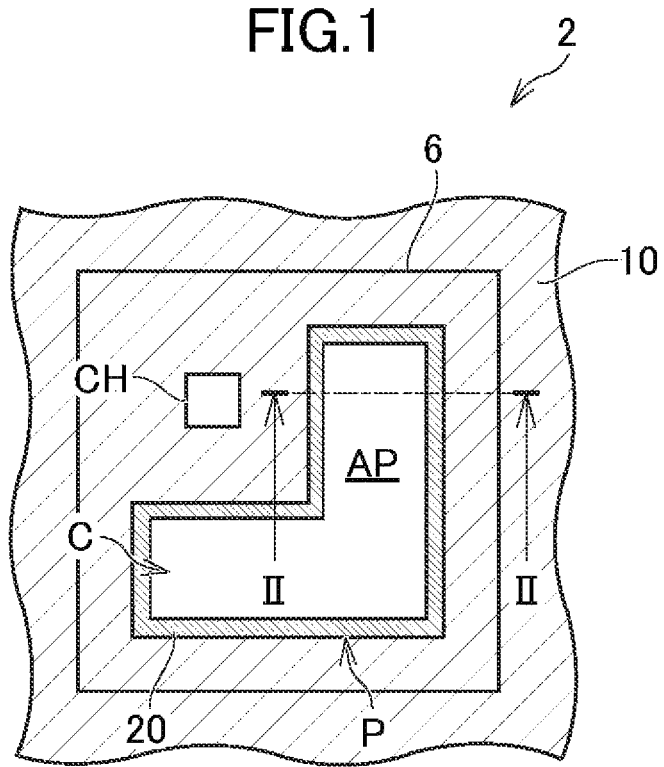
FIG. 1 is a plan view of an organic EL display device according to the invention.

Hereinafter, an embodiment of the invention will be described with reference to the drawings. The disclosure is illustrative only. Appropriate modifications that will readily occur to those skilled in the art and fall within the gist of the invention are of course included in the scope of the invention. In the drawings, the width, thickness, shape, and the like of each part may be schematically represented, compared to those in practicing aspects of the invention, for more clarity of description. However, they are illustrative only, and do not limit the interpretation of the invention.

FIG. 1 is a plan view of an organic electroluminescent (EL) display device 2 according to the invention. The organic EL display device 2 includes a plurality of pixels, and FIG. 1 shows an example of a plan view of one pixel. As shown in the drawing, the organic EL display device 2 is provided with lower electrodes 6 each for each of the pixels. The lower electrode 6 is a conductive film made of, for example, indium tin oxide (ITO). Moreover, the organic EL display device 2 is provided with a bank layer 10 that defines the plurality of pixels. In the drawing, the hatched region represents the bank layer 10. The bank layer 10 is formed so as to cover the periphery of the lower electrode 6, and overlaps the peripheral edge of the lower electrode 6. In the bank layer 10, a bank opening AP is formed for each of the pixels, and a portion of the lower electrode 6 is exposed in the bank opening AP. Moreover, an intermediate layer 20 described later is formed at the edge of the bank opening AP. Reference sign P indicates a region (hereinafter referred to as "edge region P") where the intermediate layer 20 is present when the pixel is viewed in a plan view. Reference sign C indicates a region (hereinafter referred to as "inner region C") located inside the edge region P when the pixel is viewed in the plan view. In the organic EL display device 2, a contact hole CH is provided for each of the pixels. The contact hole CH is covered with the bank layer 10. The edge region P corresponds to a first region of the invention, and the inner region C corresponds to a second region of the invention.

The shape of the bank opening AP is not limited to that shown in FIG. 1. Moreover, the pixels may be aligned in any manner. For example, a red pixel, a green pixel, a blue pixel, and a white pixel may be aligned clockwise in a predetermined order, or may be aligned in a row.

Figure 2:
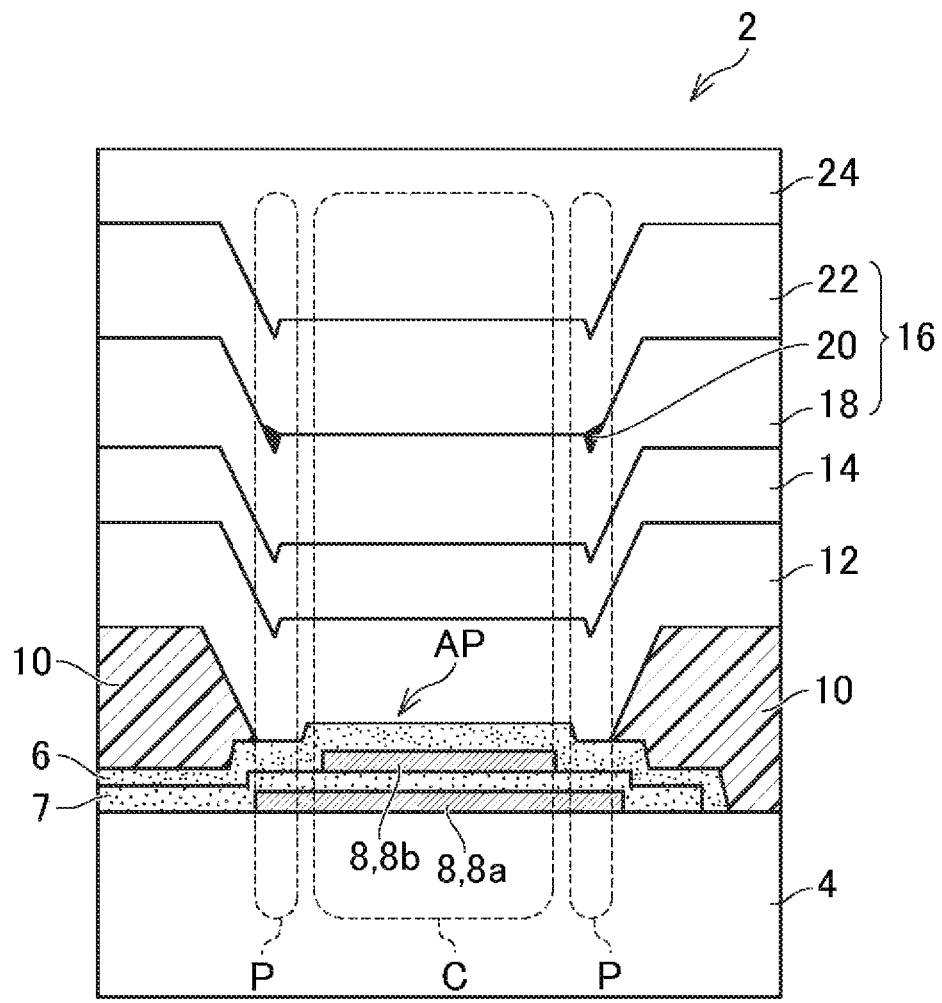
FIG. 2 is a cross-sectional view taken along the line II-II shown in FIG. 1.

FIG. 2 is a diagram for explaining other components of the organic EL display device 2 and is a cross-sectional view taken along the line II-II shown in FIG. 1. FIG. 2 is a cross-sectional view of one pixel as well.

As shown in FIG. 2, the organic EL display device 2 is provided with an organic layer 12. The organic layer 12 includes a light-emitting layer that emits light through an organic electroluminescence phenomenon. The organic layer 12 has a portion formed in the bank opening AP. Specifically, the organic layer 12 is provided so as to continuously lie on the bank layer 10 and the lower electrode 6. Hence, the organic layer 12 is in contact with the lower electrode 6 at the bank opening AP. Moreover, the organic EL display device 2 is provided with an upper electrode 14. The upper electrode 14 is provided so as to continuously lie on the organic layer 12. The lower electrode 6, the organic layer 12, and the upper electrode 14 form an organic light-emitting diode. By applying a voltage to the lower electrode 6 and the upper electrode 14, electrons and holes are injected from the lower electrode 6 and the upper electrode, respectively, into the organic layer 12, and the injected holes and electrons are combined in the light-emitting layer to emit light. The bank layer 10 prevents a short circuit between the lower electrode 6 and the upper electrode 14.

As shown in FIG. 2, the upper electrode 14 is sealed by a barrier layer 16. That is, the barrier layer 16 is formed so as to continuously lie on the upper electrode 14. The barrier layer 16 protects the organic light-emitting diode (particularly the organic layer 12) against moisture. A color filter substrate (not shown) is provided above the barrier layer 16, and a space between the barrier layer 16 and the color filter substrate is filled with a filling material 24.

The barrier layer 16 includes a first inorganic barrier layer 18, a second inorganic barrier layer 22, and the intermediate layer 20 between the two inorganic barrier layers. The first inorganic barrier layer 18 is provided to protect the organic light-emitting diode against moisture. As shown in FIG. 2, the first inorganic barrier layer 18 continuously lies on the upper electrode 14 and covers the organic layer 12. The first inorganic barrier layer 18 is formed of an inorganic material (e.g., SiN) that prevents the permeation of moisture. The first inorganic barrier layer 18 is formed by, for example, depositing the inorganic material on the upper electrode 14 by a plasma CVD method. When a foreign substance is mixed into the first inorganic barrier layer 18, a pinhole is formed in the first inorganic barrier layer 18.

The pinhole becomes the cause of the entry of moisture from the outside. For that reason, the intermediate layer 20 is provided to fill the pinhole. Moreover, the second inorganic barrier layer 22 is provided to completely cover the foreign substance. The intermediate layer 20 is formed of a different material from those of the first inorganic barrier layer 18 and the second inorganic barrier layer 22, and formed at the edge of the bank opening AP or in the pinhole. The intermediate layer 20 is formed of an organic material such as acrylic resin, polyimide resin, or epoxy resin. In FIG. 2, since a foreign substance is not mixed, the intermediate layer 20 is formed only at the edge of the bank opening AP. The second inorganic barrier layer 22 is formed of an inorganic material (e.g., SiN) that prevents the permeation of moisture, similarly to the first inorganic barrier layer 18, and provided so as to cover the first inorganic barrier layer 18 and the intermediate layer 20.

The intermediate layer 20 is formed by, for example, mist spraying a solvent on the first inorganic barrier layer 18 under a vacuum environment. The solvent obtained by mixing the organic material constituting the intermediate layer 20 with a polymerization initiator. Specifically, the solvent is mist sprayed intermittently by a fixed amount. Since the attached organic material behaves as liquid, the organic material tends to gather at a non-flat place due to surface tension but is hard to gather at a flat place. Therefore, the organic material collects at the edge of the bank opening AP and in the pinhole but does not collect at the other places, or there is little collected organic material if any. The intermediate layer 20 is to be provided at the edge of the bank opening AP and in the vicinity of the pinhole. When a thin film of organic material is formed at a flat place, it is desirable to remove this thin film by etching. The second inorganic barrier layer 22 is formed by, for example, depositing the inorganic material by a plasma CVD method. The foreign substance is surrounded by the intermediate layer 20 formed in the pinhole. Therefore, the second inorganic barrier layer 22 is not broken by the foreign substance, and the foreign substance can be completely covered.

As shown in FIG. 2, a planarization film 4 is provided under the lower electrode 6. The planarization film 4 lies on a thin film transistor (TFT) substrate (not shown). In the planarization film 4, the contact hole CH (not shown in FIG. 2) shown in FIG. 1 is formed for each of the pixels. The lower electrode 6 is connected via the contact hole CH to a TFT element on the TFT substrate.

A reflection film 8 is provided under the lower electrode 6. The reflection film 8 is provided for each of the pixels. In the example shown in FIG. 2, a reflection film 8a and a reflection film 8b are provided as the reflection film 8 for each of the pixels. The reflection film 8a reflects light in the edge region P. The reflection film 8b reflects light in the inner region C. In the example shown in FIG. 2, the reflection film 8a overlaps both the edge region P and the inner region C, while the reflection film 8b overlaps only the inner region C. That is, the inner region C includes the reflection film 8b, but the edge region P includes only the reflection film 8a and does not include the reflection film 8b. Therefore, light in the inner region C is reflected by the reflection film 8b that is not present in the edge region P, while light in the edge region P is reflected by the reflection film 8a. The reflection film 8a may be formed so as to overlap only the edge region P.

A conductive film 7 made of ITO is formed under the lower electrode 6 between the reflection film 8a and the reflection film 8b. The lower electrode 6 lies on the conductive film 7 outside the edge region P. If the lower electrode 6 is electrically connected with the TFT element, a non-conductive transparent layer may be formed instead of the conductive film 7.

Figure 3:
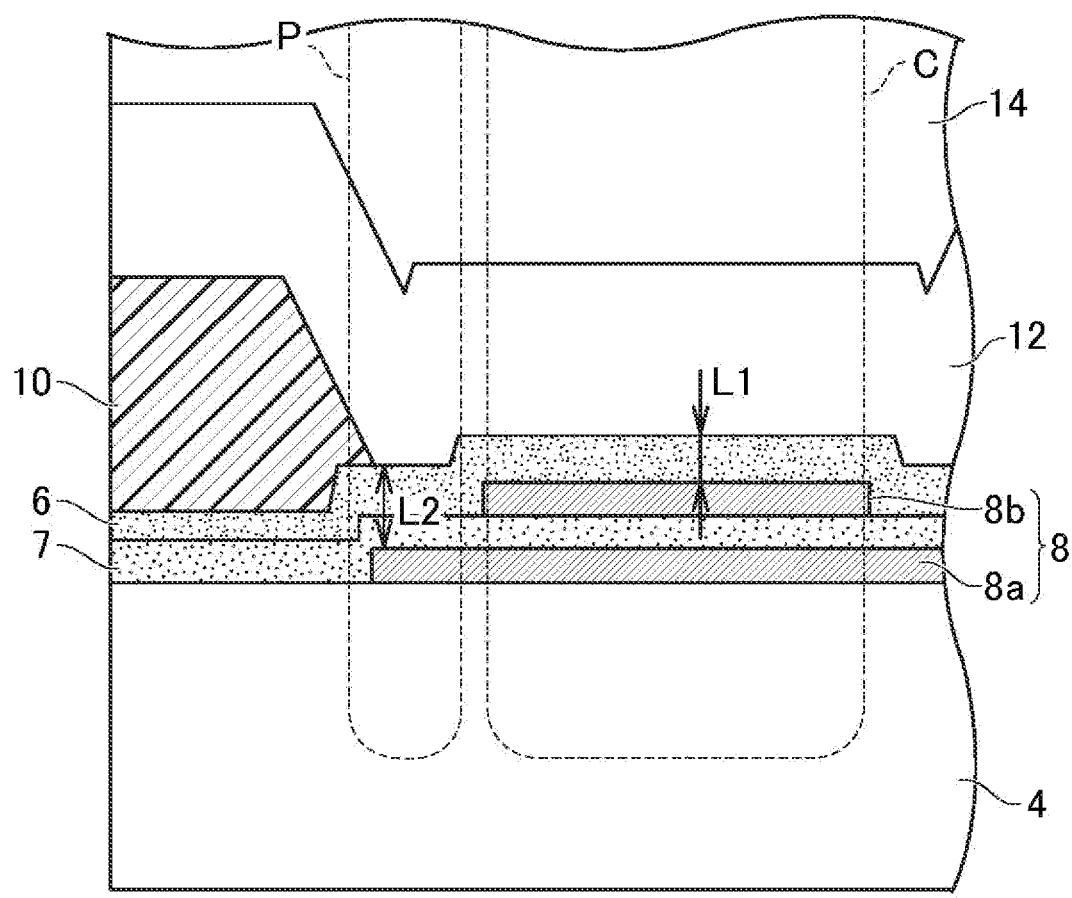
FIG. 3 is an enlarged view of a reflection film and its vicinity.

FIG. 3 is an enlarged view of the reflection film 8 and its vicinity of FIG. 2. Reference sign L1 represents a distance between the organic layer 12 and the reflection film 8 in the inner region C. Reference sign L2 represents a distance between the organic layer 12 and the reflection film 8 in the edge region P. In the layer structure shown in FIG. 2, since light in the inner region C is reflected by the reflection film 8b that is not present in the edge region P, the distance between the reflection film 8b and the organic layer 12 (i.e., the film thickness of the lower electrode 6) corresponds to the distance L1. Moreover, since light in the edge region P is reflected by the reflection film 8a, the distance between the reflection film 8a and the organic layer 12 (the sum of the film thicknesses of the lower electrode 6 and the conductive film 7) corresponds to the distance L2. In the example shown in FIGS. 2 and 3, the number of layers (only the lower electrode 6) present between the reflection film 8 (i.e., the reflection film 8b) and the organic layer 12 in the inner region C is different from the number of layers (the lower electrode 6 and the conductive film 7) present between the reflection film 8 (i.e., the reflection film 8a) and the organic layer 12 in the edge region P, so that the distance L1 and the distance L2 are different from each other. In the example shown in FIG. 2, the distance L1 is set to "A", and the distance L2 is set to "B".

A microcavity effect is affected not only by reflection at an interface of the upper electrode 14 but also by reflection at an interface of the barrier layer 16. Therefore, since the intermediate layer 20 is not present in the inner region C but the intermediate layer 20 is present in the edge region P, the edge region P and the inner region C are not uniform in the optical characteristics (emission intensity and chromaticity) of output light due to a microcavity effect under the same conditions.

Figure 4A:
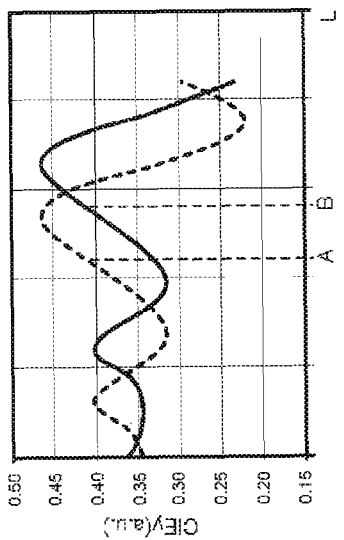
FIG. 4A is a graph showing the relation between a distance from a reflection film to an organic layer and an optical characteristic of output light.
Figure 4B:
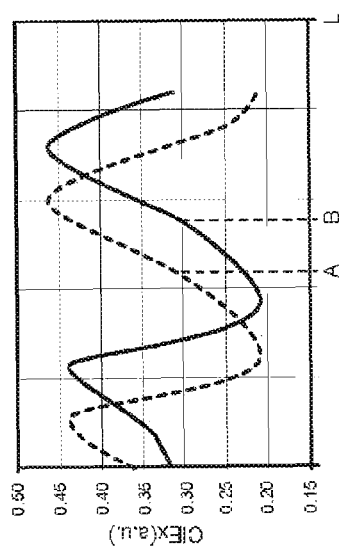
FIG. 4B is a graph showing the relation between the distance from the reflection film to the organic layer and an X-component of the chromaticity of the output light.
Figure 4C:
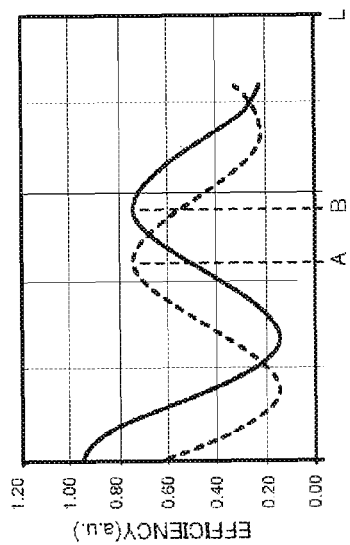
FIG. 4C is a graph showing the relation between the distance from the reflection film to the organic layer and a Y-component of the chromaticity of the output light.

For example, as shown in FIGS. 4A to 4C, when the distance L between the reflection film 8 and the organic layer 12 in the inner region C is the same as that in the edge region P, the edge region P and the inner region C are not uniform in the optical characteristics of the output light. FIGS. 4A to 4C are graphs showing the relations between the distance L and the optical characteristics of the output light. FIG. 4A shows a graph in which the horizontal axis represents the distance L and the vertical axis represents the emission intensity. FIG. 4A shows the relation between the distance L and the emission intensity. The dashed line represents the relation between the distance L and the emission intensity in the inner region C; and the solid line represents the relation between the distance L and the emission intensity in the edge region P. According to the graph, when the distance L in the inner region C and the distance L in the edge region P are set to be the same as each other, the emission intensities in the regions are different from each other. For example, the emission intensity reaches its peak when the distance L is "A" in the inner region C; while, in the edge region P, the emission intensity reaches its peak when the distance L is "B". Thus, the distance L at which the emission intensity reaches its peak in the inner region C is different from that in the edge region P.

FIG. 4B shows a graph in which the horizontal axis represents the distance L and the vertical axis represents an X-component of the chromaticity of the output light, showing the relation between the distance L and the X-component of the chromaticity of the output light. The dashed line represents the relation between the distance L and the X-component of the chromaticity in the inner region C; and the solid line represents the relation between the distance L and the X-component of the chromaticity in the edge region P. FIG. 4C shows a graph in which the horizontal axis represents the distance L and the vertical axis represents a Y-component of the chromaticity of the output light, showing the relation between the distance L and the Y-component of the chromaticity of the output light. The dashed line represents the relation between the distance L and the Y-component of the chromaticity in the inner region C; and the solid line represents the relation between the distance L and the Y-component of the chromaticity in the edge region P. As shown in the graphs, when the distance L in the inner region C and the distance L in the edge region P are set to be the same as each other, the chromaticities (the X-component and the Y-component) in the regions are different from each other. For example, when the distance L in the inner region C is set to "A", the inner region C and the edge region P cannot be uniform in chromaticity unless the distance L in the edge region P is set to "B".

In the organic EL display device 2, therefore, the layer structure under the intermediate layer 20 in the edge region P is different from that in the inner region C so that the optical characteristics of the output light in the edge region P are the same as those in the inner region C. Specifically, the reflection film 8 (the reflection film 8b in the example shown in FIGS. 2 and 3) that reflects light in the inner region C is provided separately from the reflection film 8 (the reflection film 8a in the example shown in FIGS. 2 and 3) that reflects light in the edge region P, and the number of layers present between one of the reflection films 8 and the organic layer 12 is made different from the number of layers present between the other reflection film 8 and the organic layer 12, whereby L1 and L2 are made different from each other. In the example shown in FIGS. 2 and 3, L2 is longer than L1. Hence, it is possible to reduce the difference in optical characteristics (emission color and emission intensity) between the edge region P and the inner region C. Especially in the example shown in FIG. 2, L1 is set to "A", and L2 is set to "B". Therefore, as is understood from FIGS. 4A to 4C, the edge region P and the inner region C can be uniform in optical characteristics with high accuracy.

Depending on the material constituting the intermediate layer (more specifically, the refractive index of light in the intermediate layer 20), L1 may be longer than L2. For example, in FIG. 2, the reflection film 8b may be provided only in the edge region P, and the reflection film 8a may be provided only in the inner region C. In this case, the edge region P includes the reflection film 8b, but the inner region C only includes the reflection film 8a and does not include the reflection film 8b. That is, contrary to the example shown in FIG. 2, the distance between the reflection film 8a and the organic layer 12 corresponds to L1, and the distance between the reflection film 8b and the organic layer 12 corresponds to L2. In this manner, since the reflection film 8b is provided above the reflection film 8a, L1 can be longer than L2.

Figure 5:
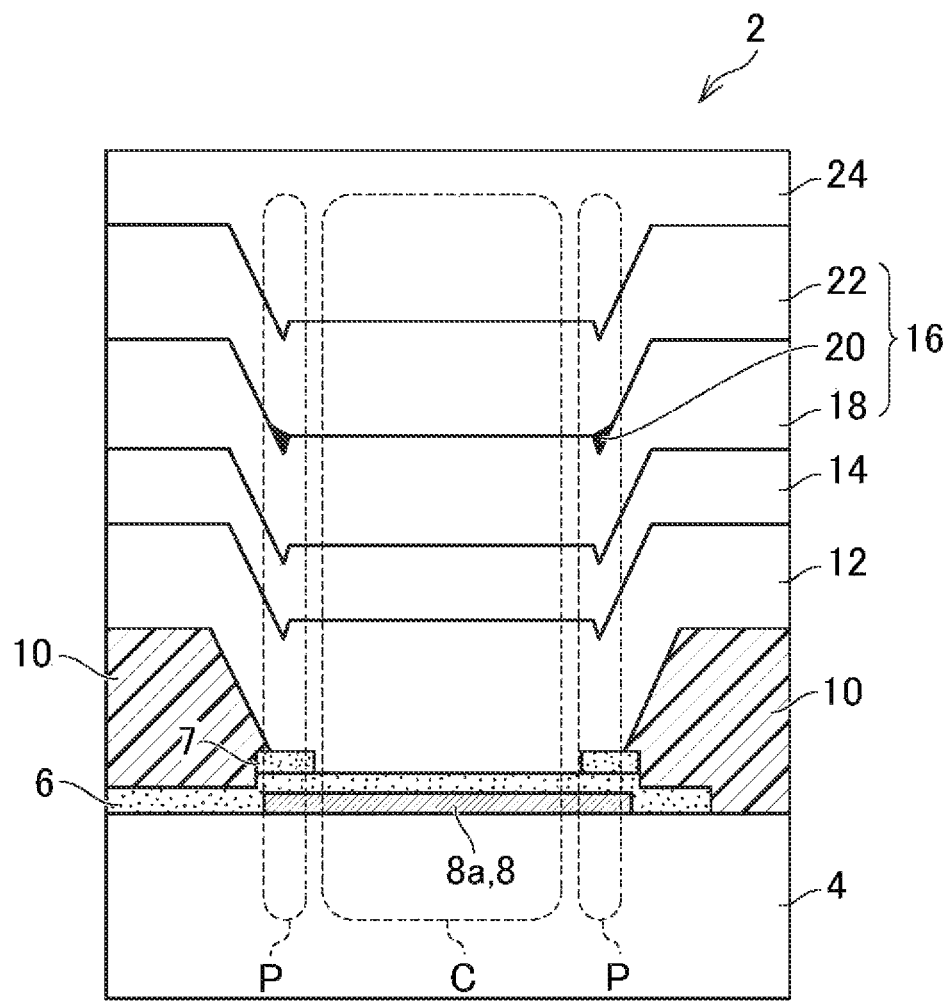
FIG. 5 shows a cross-sectional view taken along the line II-II in a modified example.
Figure 6:
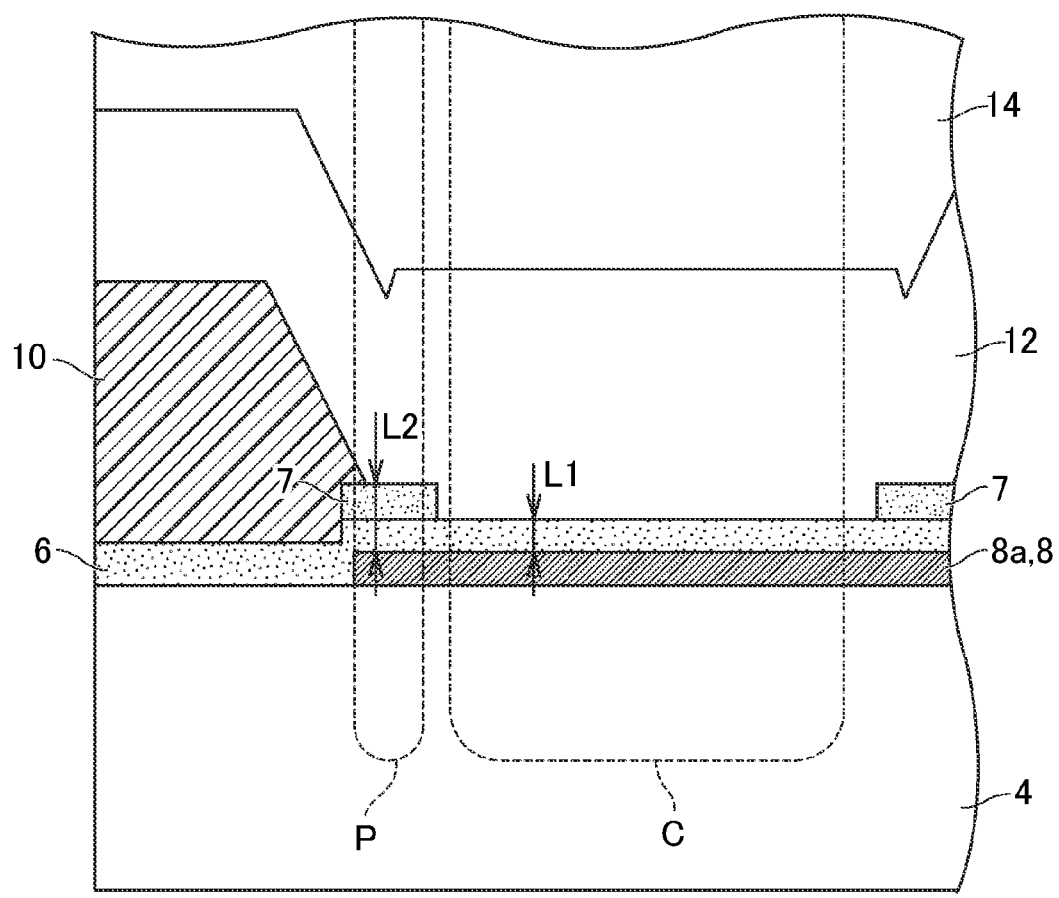
FIG. 6 is an enlarged view of a reflection film and its vicinity in the modified example.

It is possible to make L1 and L2 different from each other by providing only one reflection film 8 under the lower electrode 6. FIG. 5 shows a cross-sectional view of a pixel in this example (hereinafter referred to as "modified example"). FIG. 6 is an enlarged view of the reflection film 8 and its vicinity of FIG. 5. In the modified example, only one reflection film 8 is provided for each of the pixels, and only the reflection film 8a is provided under the lower electrode 6 as shown in FIG. 5. Further, unlike FIG. 2, the reflection film 8a overlaps not only the inner region C but also the edge region P. Therefore, light in the edge region P and light in the inner region C are both reflected by the reflection film 8a. Moreover, as shown in FIG. 6, the distance between the reflection film 8a and the organic layer 12 in the inner region C corresponds to L1, and the distance between the reflection film 8a and the organic layer 12 in the edge region P corresponds to L2.

Moreover, in the modified example, the lower electrode 6 and the conductive film 7 are formed in this order on the reflection film 8a, and the conductive film 7 is formed only in the edge region P. Accordingly, the edge region P includes, between the reflection film 8a and the organic layer 12, the lower electrode 6 and the conductive film 7, but the inner region C only includes the lower electrode 6 between the reflection film 8a and the organic layer 12 and does not include the conductive film 7 therebetween. With this configuration, L2 can be longer than L1. That is, it is possible also in the modified example to reduce the difference in optical characteristics between the edge region P and the inner region C. Also in the modified example, L1 may be longer than L2 depending on the material constituting the intermediate layer 20. That is, in FIG. 5, the conductive film 7 may be formed only in the inner region C. By doing this, the inner region C includes, between the reflection film 8a and the organic layer 12, the lower electrode 6 and the conductive film 7, but the edge region P only includes the lower electrode 6 between the reflection film 8a and the organic layer 12 and does not include the conductive film 7 therebetween, and thus L1 can be longer than L2.

It is possible in the modified example to make L1 and L2 different from each other by omitting the conductive film 7. For example, after the lower electrode 6 is formed, the lower electrode 6 is half-etched only in one of the inner region C and the edge region P.

The invention is not limited to the embodiment described above, and various modifications can be made. For example, the configuration described in the embodiment can be replaced with substantially the same configuration, a configuration providing the same operational effect, or a configuration capable of achieving the same object.

For example, in the embodiment described above, the layer structure of the edge region P and the layer structure of the inner region C are made different from each other under the intermediate layer 20, so that L1 and L2 are made different from each other and thus the difference in the optical characteristics of the output light between the edge region P and the inner region C is reduced. Specifically, one of the edge region P and the inner region C is provided with, under the intermediate layer 20, a layer that is not present in the other, whereby L1 and L2 are made different from each other. For example, in the example shown in FIG. 2, the inner region C is provided with the reflection film 8b as a layer not present in the edge region P. Moreover, in the example shown in FIG. 5 for example, the edge region P is provided with the conductive film 7 as a layer not present in the inner region C.

However, even when L1 and L2 are not different from each other, it is possible to reduce the difference in optical characteristics between the edge region P and the inner region C. That is, a layer such as canceling out the influence of the intermediate layer 20 on the microcavity effect is provided on or under the intermediate layer 20 (e.g., in the inorganic barrier layer 22) only in one of the edge region P and the inner region C, so that the layer structure of the edge region P and the layer structure of the inner region C may be made different from each other.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An organic EL display device comprising:
    lower electrodes each provided for each of pixels;
    a bank layer formed so as to cover the peripheries of the lower electrodes and including bank openings through each of which a portion of the lower electrode is exposed;
    an organic layer including a light-emitting layer and portions each formed in the bank opening;
    a first barrier layer covering the organic layer;

a second barrier layer covering the first barrier layer;

an intermediate layer formed between the first barrier layer and the second barrier layer, formed of a different material from those of the first barrier layer and the second barrier layer, and located at the edges of the bank openings;

a first light reflection film and a second light reflection film are provided under the lower electrode for each of the pixels, a conductive film under the lower electrode, a first region where the intermediate layer is located when the pixel is viewed in a plan view; and a second region located inside the first region, wherein the first light reflection film, the conductive film, the second light reflection film, the lower electrode, and the organic layer are formed in this order, and one of the first region and the second region includes the second light reflection film, while the other includes the first light reflection film and does not include the second light reflection film, a distance from the organic layer to the first light reflection film in the first region is different from a distance from the organic layer to the second light reflection film in the second region.

2. An organic EL display device comprising:

lower electrodes each provided for each of pixels;

a bank layer formed so as to cover the peripheries of the lower electrodes and including bank openings through each of which a portion of the lower electrode is exposed;

an organic layer including a light-emitting layer and portions each formed in the bank opening;

a first barrier layer covering the organic layer;

a second barrier layer covering the first barrier layer;

an intermediate layer formed between the first barrier layer and the second barrier layer, formed of a different material from those of the first barrier layer and the second barrier layer, and located at the edges of the bank openings;

light reflection films each provided under the lower electrode for each of the pixels;

a conductive film above the lower electrode, a first region where the intermediate layer is located when the pixel is viewed in a plan view; and a second region located inside the first region, wherein the light reflection film, the lower electrode, the conductive film, and the organic layer are formed in this order, and one of the first region and the second region includes both the lower electrode and the conductive film, while the other includes the lower electrode and does not include the conductive film, a distance from the organic layer to the light reflection film in the first region is different from a distance from the organic layer to the light reflection film in the second region.

* * * * *